(12) United States Patent
Xu et al.

(10) Patent No.: US 10,592,722 B2
(45) Date of Patent: Mar. 17, 2020

(54) PHOTOSENSITIVE UNIT, PHOTOSENSITIVE MODULE AND DISPLAY DEVICE

(71) Applicant: BOE Technology Group Co., Ltd., Beijing (CN)

(72) Inventors: Rui Xu, Beijing (CN); Haisheng Wang, Beijing (CN); Yingming Liu, Beijing (CN); Xiaoliang Ding, Beijing (CN); Xiandong Meng, Beijing (CN); Xue Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 93 days.

(21) Appl. No.: 15/991,457

(22) Filed: May 29, 2018

(65) Prior Publication Data

US 2019/0065813 A1 Feb. 28, 2019

(30) Foreign Application Priority Data

Aug. 23, 2017 (CN) .......................... 2017 1 0731747

(51) Int. Cl.
*G06K 9/28* (2006.01)
*G06K 9/00* (2006.01)
(Continued)

(52) U.S. Cl.
CPC ............. *G06K 9/0004* (2013.01); *G02B 6/10* (2013.01); *G02B 27/30* (2013.01); *H01L 25/167* (2013.01);
(Continued)

(58) Field of Classification Search
CPC ............. G06K 9/0004; G06K 9/00046; G06K 9/00006–0012
See application file for complete search history.

(56) References Cited

U.S. PATENT DOCUMENTS

2015/0078035 A1 3/2015 Nichol et al.
2017/0161543 A1* 6/2017 Smith .................. G06K 9/0008

FOREIGN PATENT DOCUMENTS

CN 106897699 A 6/2017

OTHER PUBLICATIONS

Chinese Office Action in Chinese Patent Application No. 201710731747.8 dated Feb. 3, 2020 and English translation thereof.

* cited by examiner

*Primary Examiner* — Brian Werner
(74) *Attorney, Agent, or Firm* — Fay Sharpe LLP

(57) ABSTRACT

A photosensitive unit, a photosensitive module and a display device are provided. The photosensitive unit includes: a light-emitting structure, a photoelectric converter, an optical waveguide device and a collimator. The converter and collimator are disposed on the same side of the optical waveguide device side by side, the light-emitting structure is disposed on one side of the converter away from the optical waveguide device, and one side on the converter close to the light-emitting structure is light-shielding; the light-emitting structure is capable of emitting light rays to a target side thereof away from the converter; the collimator is capable of screening collimating light rays in the light rays incident from the target side, and controlling the collimating light rays to be incident to the optical waveguide device; the optical waveguide device is capable of controlling the collimating light rays incident from the collimator to be incident to the converter.

20 Claims, 10 Drawing Sheets

(51) Int. Cl.
  *G02B 27/30* (2006.01)
  *H01L 27/146* (2006.01)
  *H01L 25/16* (2006.01)
  *H01L 51/52* (2006.01)
  *G02B 6/10* (2006.01)
  *H01L 27/32* (2006.01)
(52) U.S. Cl.
  CPC .... *H01L 27/14643* (2013.01); *H01L 27/3227* (2013.01); *H01L 51/5203* (2013.01)

PHOTOSENSITIVE UNIT, PHOTOSENSITIVE MODULE AND DISPLAY DEVICE

CROSS-REFERENCE TO RELATED APPLICATION

This application claims priority to Chinese Patent Application No. 201710731747.8, filed with the State Intellectual Property Office on Aug. 23, 2017 and titled "PHOTOSENSITIVE UNIT, PHOTOSENSITIVE MODULE AND DISPLAY DEVICE," the entire contents of which are incorporated herein by reference.

TECHNICAL FIELD

The present disclosure relates to a photosensitive unit, a photosensitive module and a display device.

BACKGROUND

Fingerprint recognition display devices are the display devices having a display function. The fingerprint recognition display device comprises a display panel, a cover plate, a processor, a light-emitting structure and a plurality of photodiodes. The plurality of photodiodes are usually disposed in a non-display region of the display panel, for example, at a home key (also called as initial key) of the fingerprint recognition display device.

In related technologies, the photodiodes are connected to the processor. The light-emitting structure can emit light rays to the cover plate. When the finger touches the home key on the cover plate, the photodiodes can receive the light rays reflected by the finger, and output electrical signals of corresponding intensities to the processor according to the intensities of the received light rays. The fingerprints have multiple valleys and multiple ridges, and the valleys and the ridges have different heights and different distribution positions. Therefore, the plurality of photodiodes can receive the light rays of different intensities reflected by the valleys and the ridges respectively. The processor can receive the electrical signals of different intensities input by the plurality of photodiodes and determine the valleys and the ridges in the fingerprints according to the multiple electrical signals of different intensities, so as to recognize the fingerprints. When the fingerprint recognition display device is manufactured, usually an opening is required to be cut in the cover plate corresponding to the home key, and the plurality of photodiodes are placed in the opening, such that a distance between the photodiodes and the finger is reduced, thereby ensuring that the degree of scattering of the light rays received by the photodiodes is smaller, and improving the accuracy of fingerprint recognizing.

When the fingerprint recognition display device is manufactured in the related technologies, the opening is required to be cut in the cover plate and the cover plate is relative easy to rupture when the opening is cut in the cover plate. Therefore, the difficulty of a manufacturing process for the fingerprint recognition display device is high.

SUMMARY

The present disclosure provides a photosensitive unit, a photosensitive module and a display device.

In a first aspect, there is provided a photosensitive unit, including a light-emitting structure, a photoelectric converter, an optical waveguide device and a collimator; wherein the photoelectric converter and the collimator are disposed on the same side of the optical waveguide device side by side, the light-emitting, structure is disposed on one side of the photoelectric converter away from the optical waveguide device, and one side on the photoelectric converter dose to the light-emitting structure is light-shielding; the light-emitting structure is capable of emitting light rays to a target side thereof away from the photoelectric converter; the collimator is capable of screening collimating light rays in the light rays incident from the target side, and controlling the collimating light rays to be incident to the optical waveguide device, wherein a propagation direction before the collimating light rays are incident to the collimator is in the preset range of a first direction, and the first direction is perpendicular to a light emergent surface of the light-emitting structure; and the optical waveguide device is capable of controlling the collimating light rays incident from the collimator to be incident to the photoelectric converter.

Optionally, a surface in the optical waveguide device toward the collimator is a first surface, a light incident grating is disposed in a region in the first surface facing the collimator, and a light emergent grating is disposed in a region in the first surface facing the photoelectric converter; and the light incident grating is configured to guide the incident collimating light rays into the optical waveguide device, and the light emergent grating is configured to guide the collimating light rays in the optical waveguide device to the photoelectric converter.

Optionally, the collimator comprises a plurality of light absorption strips, wherein the plurality of light absorption strips are disposed in parallel, and a length direction of each light absorption strip is parallel with the first direction, and a. gap exists between any two adjacent light absorption strips.

Optionally, the collimator comprises a first light absorption board and a second light absorption board; wherein the first light absorption board and the second light absorption board are disposed in parallel, and are both perpendicular to the first direction; and the first light absorption board is provided with a first opening, the second light absorption board is provided with a second opening, and orthogonal projections of the first opening and the second opening on the optical waveguide device are completely overlapped.

Optionally, the photoelectric converter is a photodiode, wherein the photodiode comprises a photoelectric converting layer, one side of the photoelectric converting layer close to the light-emitting structure is provided with a light-shielding electrode, and one side of the photoelectric converting layer away from the light-emitting structure is provided with a light-transmitting electrode.

Optionally, the light-emitting unit is an organic light-emitting diode, wherein the organic light-emitting diode comprises an electroluminescence layer and a first electrode layer and a second electrode layer which are located on each of the two sides of the electroluminescence layer respectively, the first electrode layer is disposed away from the photoelectric converter, and the second electrode layer is disposed close to the photoelectric converter; and the first electrode layer is a light-transmitting electrode, and the second electrode layer is a light-shielding electrode.

Optionally, the photosensitive unit further comprises a switching transistor, wherein the switching transistor is disposed on one side of the photoelectric converter away from the collimator, and the photoelectric converter is connected to a processor by the switching transistor.

Optionally, the photosensitive unit further comprises a light-shielding block. An active layer in the switching transistor is located on one side in the optical waveguide device close to the photoelectric converter, and the light-shielding block covers one side of the active layer close to the optical waveguide device.

Optionally, other sides on the photoelectric converter except the one side close to the optical waveguide device are all light-shielding.

Optionally, the light incident grating and the light emergent grating are both nano-gratings.

Optionally, a thickness sum of the optical waveguide device and the photoelectric converter is smaller than 100 micrometers.

In a second aspect, there is provided a photosensitive module, comprising: a processor and a plurality of photosensitive units, wherein the photosensitive unit comprises: a light-emitting structure, a photoelectric converter, an optical waveguide device and a collimator. The photoelectric convener and the collimator are disposed on the same side of the optical waveguide device side by side, the light-emitting structure is disposed on one side of the photoelectric converter away from the optical waveguide device, and one side on the photoelectric converter close to the light-emitting structure is light-shielding.

The light-emitting structure is capable of emitting light rays to a target side thereof away from the photoelectric converter; the collimator is capable of screening collimating light rays in the light rays incident from the target side, and controlling the collimating light rays to be incident to the optical waveguide device; wherein a propagation direction before the collimating light rays are incident to the collimator is in the preset range of a first direction, and the first direction is perpendicular to a light emergent surface of the light-emitting structure; and the optical waveguide device is capable of controlling the collimating light rays incident from the collimator to be incident to the photoelectric converter, and the processor is connected to the photoelectric convener in each photosensitive unit.

Optionally, the plurality of photosensitive units form at least one photosensitive unit group, and each photosensitive unit group comprises at least one photosensitive unit.

The optical waveguide devices in all photosensitive unit groups are connected into an integral part, and the optical waveguide devices in any two photosensitive unit groups are not in contact.

Optionally, the processor is a fingerprint recognition processor.

In a third aspect, there is provided a display device, comprising a base substrate, a cover plate and a photosensitive module, wherein the photosensitive module comprises a processor and a plurality of photosensitive units, the base substrate and the cover plate are disposed oppositely, and the photosensitive units are disposed between the base substrate and the cover plate.

The photosensitive unit comprises: a light-emitting structure, a photoelectric converter, an optical waveguide device and a collimator. The photoelectric converter and the collimator are disposed on the same side of the optical waveguide device side by side, the light-emitting structure is disposed on one side of the photoelectric converter away from the optical waveguide device and close to the cover plate. One side on the photoelectric converter close to the light-emitting structure is light-shielding. The light-emitting structure is capable of emitting light rays to a target side thereof away from the photoelectric converter; the collimator is capable of screening collimating light rays in the light rays incident from the target side, and controlling the collimating light rays to be incident to the optical waveguide device; wherein a propagation direction before the collimating light rays are incident to the collimator is in the preset range of a first direction, and the first direction is perpendicular to a light emergent surface of the light-emitting structure; the optical waveguide device is capable of controlling the collimating light rays incident from the collimator to be incident to the photoelectric converter, and the processor is connected to the photoelectric converter in each photosensitive unit.

Optionally, the photosensitive units are located in a display region between the base substrate and the cover plate, the photosensitive unit further comprises a pixel circuit connected to the light-emitting structure, and the pixel circuit is configured to control the light-emitting structure to emit light, such that the display device displays an image.

Optionally, the photosensitive unit further comprises a switching transistor. In the photosensitive unit: the pixel circuit and the switching transistor are both located between the optical waveguide device and the light-emitting structure, the switching transistor is disposed close to the optical waveguide device, the pixel circuit is disposed away from the optical waveguide device, and an insulating layer is disposed between the pixel circuit and the switching transistor; and an orthogonal projection of an active layer of the switching transistor on the base substrate is within an orthogonal projection of an opaque region in the pixel circuit on the base substrate.

Optionally, wherein the light-emitting, structure comprises an OLED, and one side of the collimator away from the optical waveguide device is flush with one side of an electroluminescence layer of the OLED away from the base substrate.

Optionally, one side of the collimator away from the optical waveguide device is flush with one side of the insulating layer close to the optical waveguide device.

Optionally, the plurality of photosensitive units are all disposed in a non-display region between the base substrate and the cover plate.

DETAILED DESCRIPTION

The present disclosure will be described in further detail with reference to the enclosed drawings, to clearly present the principles, and advantages of the present disclosure.

Figure 1:
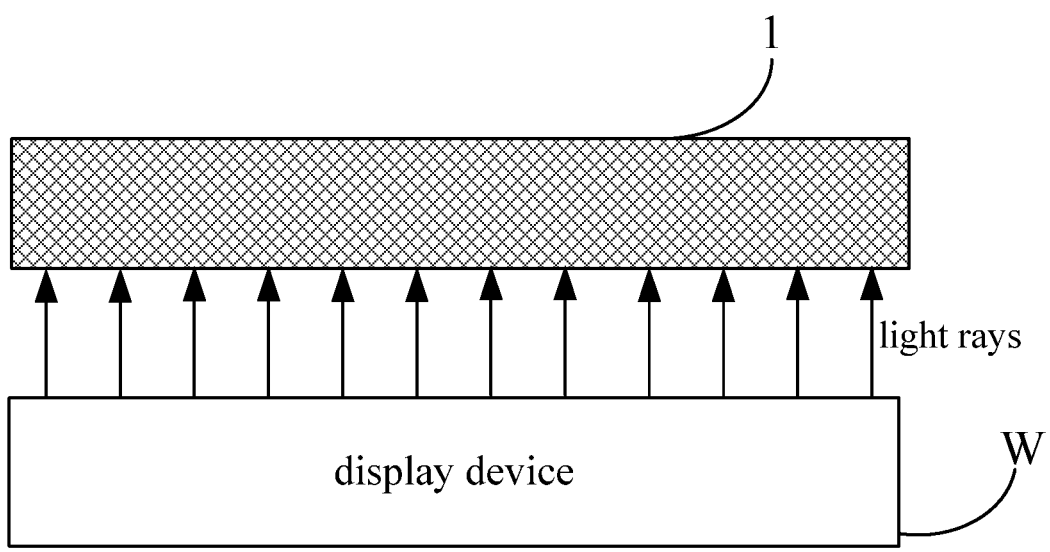
FIG. 1 is a schematic diagram of an application scenario of a photosensitive unit provided by an embodiment of the present disclosure.

FIG. 1 is a schematic diagram of an application scenario of a display device having a photosensitive function provided by an embodiment of the present disclosure. As shown in FIG. 1, when an object 1 to be imaged is imaged, the object to be imaged 1 may be disposed on the opposite side of a display device W. Then, the display device W may emit light rays to the object 1 to be imaged, and the intensities of the light rays reflected by respective regions of the object 1 to be imaged are detected. Further, an image of the object to be imaged is generated according to the detected intensities of the light rays.

Exemplarily, the object 1 to be imaged may be the pulp of a finger (finger pulp for short). The finger pulp has fingerprints, and the image generated by the display device W is the image of the fingerprints. Or, the object 1 to be imaged may be a human face, and the image generated by the display device W is the image of the human face.

It should be noted that the display device generally comprises a photosensitive module. The photosensitive module comprises a processor and a plurality of photosensitive units arranged in array. When the object to be imaged is located on an opposite side of the display device, each photosensitive unit in the display device may emit the light rays of the same brightness to the object to be imaged. Afterwards, each photosensitive unit may receive the light rays reflected by the object to be imaged. When respective positions on the surface of the object to be imaged have different heights, the light rays reflected by the respective positions to the photosensitive units facing the respective positions are different in brightness. In this way, the processor in the display device may generate the image of the object to be imaged (for example, the image of the fingerprints or the image of the human face) according to the brightness of the light rays received by respective photosensitive units.

Figure 2:
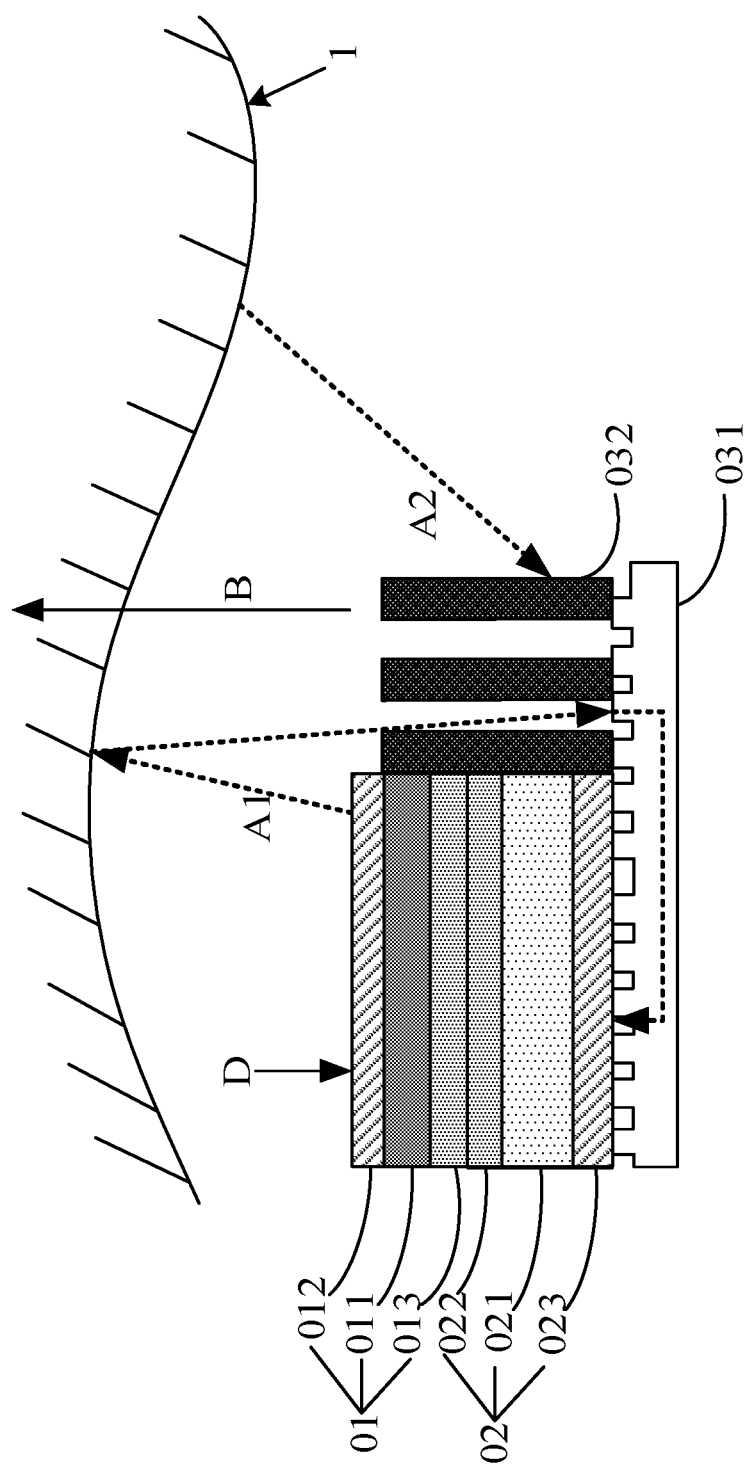
FIG. 2 is a structural schematic diagram of a photosensitive unit provided by an embodiment of the present disclosure.

FIG. 2 is a structural schematic diagram of a photosensitive unit provided by an embodiment of the present disclosure. The display device W as shown in FIG. 1 may comprise the photosensitive unit. As shown in FIG. 2, the photosensitive unit may comprise a light-emitting structure 1, a photoelectric converter 02, an optical waveguide device 031 and a collimator 032.

The photoelectric converter 02 and the collimator 032 are disposed on the same side of the optical waveguide device 031 side by side. The light-emitting structure 01 is disposed on one side of the photoelectric converter 02 away from the optical waveguide device 031. One side on the photoelectric converter 02 close to the light-emitting structure 01 is light-shielding.

The light-emitting structure 01 can emit light rays to a target side thereof away from the photoelectric converter 02. Exemplarily, the object 1 to be imaged may be located on the target side of the light-emitting structure 01.

The collimator 032 can screen collimating light rays A1 in the light rays (for example, the collimating light rays A1 and non-collimating light rays A2 as shown in FIG. 2) incident from the target side, and control the collimating light rays A1 to be incident to the optical waveguide device 031. It should be noted that the light-emitting structure 01 is perpendicular to the light emergent surface D in a first direction B. A propagation direction before the collimating light rays A1 are incident to an optical control component 03 is in a preset range of the first direction B.

The optical waveguide device 031 can control the collimating light rays A1 incident from the collimator 032 to be incident to the photoelectric converter 02.

In conclusion, since in the photosensitive unit provided by the embodiment of the present disclosure, the collimator can screen the collimating light rays in the light rays incident from the target side, and the collimating light rays are controlled to be incident to the optical waveguide device, the collimating light rays are further guided into the photoelectric converter by the optical waveguide device. When the photosensitive unit is farther away from the finger, the photoelectric converter in the photosensitive unit can still receive the collimating light rays with a smaller degree of scattering. When the display device is manufactured, the photosensitive unit can be directly disposed below a cover plate without a need to cut an opening in the cover plate. Therefore, the difficulty of a manufacturing process for the display device is reduced.

It should be noted that the light rays emitted by the light-emitting structure in the embodiment of the present disclosure may be visible light or invisible light, which is not limited by the embodiment of the present disclosure.

As shown in FIG. 2, there are many light rays incident to the collimator 032 from the target side, for example, the collimating light rays A1 emitted from the light-emitting structure 01 and reflected by the object 1 to be imaged, and the non-collimating light rays A2 emitted from the light-emitting structure 01 or other light-emitting structures and reflected by the object 1 to be imaged. The propagation direction when the collimating light rays A1 are incident to the optical control component 03 is in the preset range of the first direction B. The propagation direction when the non-collimating light rays A2 are incident to the optical control component 03 is outside the preset range of the first direction B. Therefore, the collimator 032 can screen the collimating light rays A1 of which the propagation direction is in the preset range of the first direction B in the incident light rays, and control the collimating light rays A1 to be incident to the optical waveguide device 031. Further, the collimating light rays A1 are guided into the photoelectric converter 02 by the optical waveguide device 031, and at this point, the amount of the non-collimating light rays A2 incident to the photoelectric converter 02 is zero or nearly zero.

Hence, it is guaranteed that the propagation direction before most of the light rays incident to the photoelectric converter 02 are incident to the photosensitive unit are in the preset range of the first direction B before the light rays are incident to the photosensitive unit. That is, it is guaranteed that most of the light rays incident to the photoelectric converter 02 are the light rays (i.e., the collimating light rays) reflected by an object located right above the photosensitive unit. Therefore, the relevancy between an electrical signal output by the photoelectric converter 02 according to the input light rays and the object right above photosensitive unit is higher, and the accuracy of the intensity of the electrical signal output by the photosensitive unit is improved.

Optionally, the propagation direction before the collimating light rays are incident to the collimator may be parallel with that when the collimating light rays are incident to the photoelectric converter. For example, if an included angle between the propagation direction before the collimating light rays are incident to the collimator and the first direction B is 0 degree, then the included angle between the propagation direction when the collimating light rays are incident to the photoelectric converter and the first direction may also be 0 degree. Or, the propagation direction before the collimating light rays are incident to the collimator may be irrelevant to that when the collimating light rays are incident to the photoelectric converter, and the propagation direction when the collimating light rays are incident to the photoelectric converter is parallel with the first direction B. FIG. 2 takes the fact that the propagation direction before the collimating light rays are incident to a grating is irrelevant to that when the collimating light rays are emergent from the grating and the propagation direction when the collimating light rays are emergent from the grating is parallel with the first direction B as an example.

It should be noted that the optical waveguide device 031 may be made of a transparent material. Continuing to refer to FIG. 2, a surface in the optical waveguide device 031 toward the collimator 032 is a first surface. A light incident grating is disposed in a region in the first surface facing the collimator 032. A light emergent grating is disposed in a region in the first surface facing the photoelectric converter 02. The light incident grating is configured to guide the incident collimating light rays A1 into the optical waveguide device 031, and the light emergent grating is configured to guide the collimating light rays A1 in the optical waveguide device 031 to the photoelectric converter 02. The gratings may be formed by lots of parallel adjusting bulges with equal widths and equal intervals. When the light incident grating and the light emergent grating are disposed, the length, width and height of strip bulges and the interval of the strip bulges in the gratings may be determined according to the functions required by the gratings. Afterwards, the gratings are disposed according to these parameters.

The light incident grating and the light emergent grating may be nano-gratings, such that a thickness of the optical waveguide device is smaller. Therefore, the thickness of the whole photosensitive unit is smaller. Exemplarily, the thickness sum of the optical waveguide device 031 and the photoelectric converter 02 in the photosensitive unit may be smaller than 100 micrometers.

Continuing to refer to FIG. 2, the collimator 032 may comprise a plurality of light absorption strips. The plurality of light absorption strips are disposed in parallel, and a length direction of each light absorption strip is parallel with the first direction B. A gap exists between any two adjacent light absorption strips. The material of each light absorption strip is a light absorption material. When the light rays irradiate the light absorption strips, the light absorption strips can absorb the light rays. The light absorption material may be the same as the material of a black matrix in the display device. The non-collimating light rays A2 reflected by the object 1 to be imaged will be incident to the light absorption strips to be absorbed by the same, and thus cannot be transmitted through the collimator 032. While the collimating light rays A1 reflected by the object 1 to be imaged will be incident to the gaps between the adjacent two light absorption strips, so as to be transmitted through the collimator 032 and further reach the optical waveguide device 031.

Figure 3:
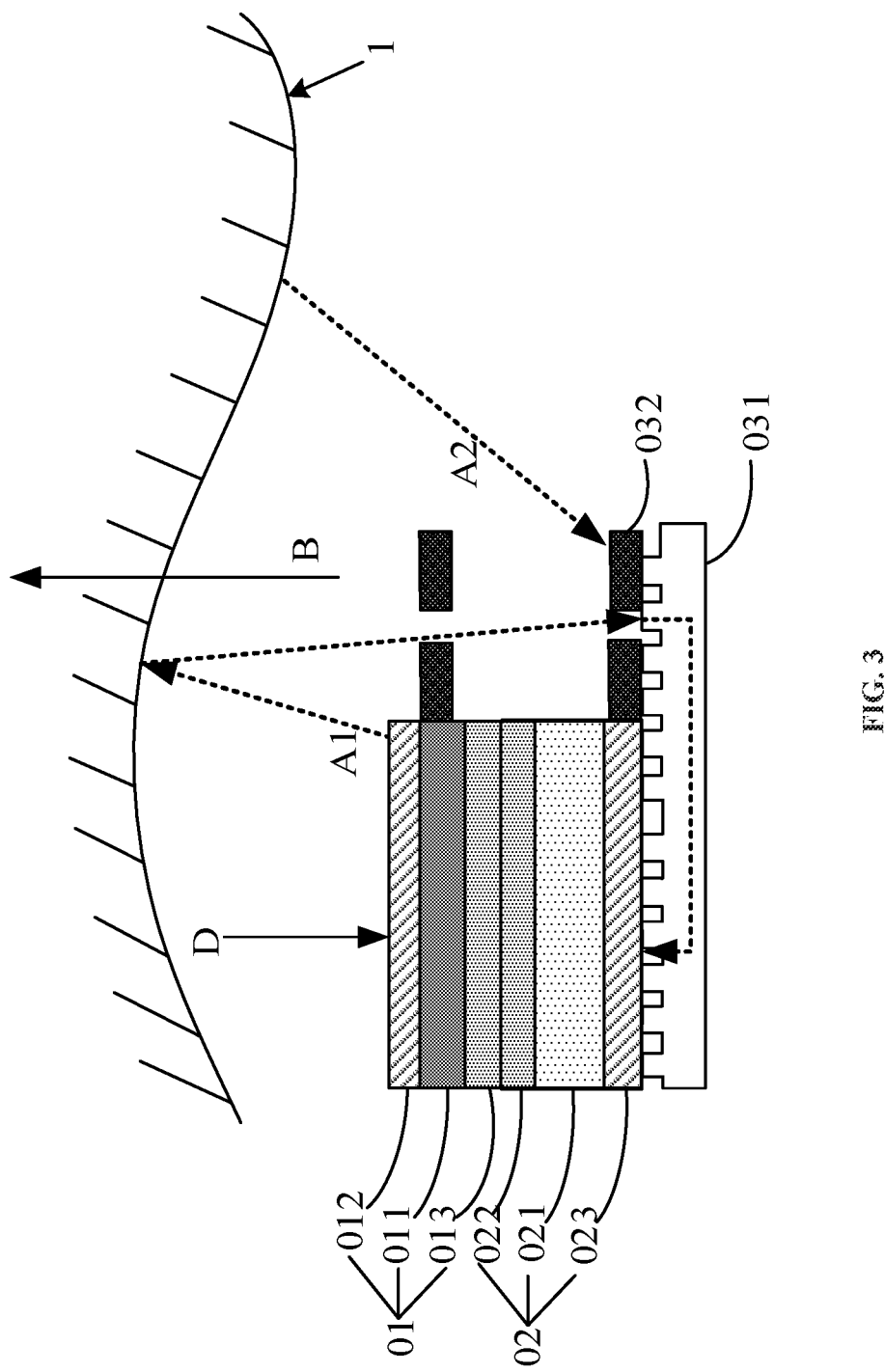
FIG. 3 is a structural schematic diagram of another photosensitive unit provided by an embodiment of the present disclosure.

Optionally, FIG. 3 is a structural schematic diagram of another photosensitive unit provided by an embodiment of the present disclosure. FIG. 3 shows another implementation mode for the collimator 032 in FIG. 2. As shown in FIG. 2, the collimator 032 may comprise a first light absorption board and a second light absorption board. The first light absorption board and the second light absorption board are disposed in parallel, and are both perpendicular to the first direction B. The first light absorption board is provided with a first opening. The second light absorption board is provided with a second opening. Orthogonal projections of the first opening and the second opening on the optical waveguide device 031 are completely overlapped.

The material of each of the first light absorption board and the second light absorption board may be a light absorption material. When the light rays irradiate the light absorption boards, the light absorption boards can absorb the light rays. The non-collimating light rays A2 reflected by the object 1 to be imaged will be incident to the light absorption boards to be absorbed by the same, and thus cannot be transmitted through the collimator 032. While the collimating light rays A1 reflected by the object 1 to be imaged will be incident to the openings in the light absorption boards, so as to be transmitted through the collimator 032 and further reach the optical waveguide device 031.

Optionally, as shown in FIG. 2 or 3, the light-emitting structure 01 may be an organic light-emitting diode (OLED). Exemplarily, the OLED may comprise an electroluminescence layer 011 and a first electrode layer 012 and a second electrode layer 013 which are located on each of two sides of the electroluminescence layer 011 respectively. The first electrode layer 012 may be disposed away from the photoelectric converter 02, and the second electrode layer 013 may be disposed close to the photoelectric converter 02. In some embodiments, the first electrode layer 012 may be a light-transmitting, electrode (for example, the electrode made of indium tin oxide), and the second electrode layer 013 may be a light-shielding electrode (for example, the electrode made of metal). It should be noted that the embodiment of the present disclosure takes the OLED as an example of the light-emitting structure. In actual application, the light-emitting structure may also be a light-emitting diode (LED), or an infrared light-emitting structure, or other light-emitting structures, which is not limited by the embodiment of the present disclosure.

The photoelectric converter 02 may be a photodiode. The photodiode may comprise a photoelectric converting layer 21. One side of the photoelectric converting layer 021 away from the grating is provided with a light-shielding electrode 022. One side of the photoelectric converting layer 021 close to the grating is provided with a light-transmitting electrode 023. The light-shielding electrode 022 is a light-shielding electrode. In actual application, there exist various photodiodes. In one aspect, the photodiode in the embodiment of the present disclosure may be a PIN type photodiode. At this point, the photosensitive converting layer 021 may comprise: an intrinsic semiconductor layer and a hole semiconductor layer and an electronic semiconductor layer which are located on each of two sides of the intrinsic semiconductor layer respectively. In the other aspect, the photodiode in the embodiment of the present disclosure may be an organic photodiode (OPD).

Optionally, each side not provided with the light-transmitting electrode 023 and the light-shielding electrode 022 in the photoelectric converting layer 021 may be covered by a light-shielding layer. Under actions of these light-shielding layers and the light-shielding electrode 022, except that one side of the photoelectric converter 02 close to the optical waveguide device (i.e., the side provided with the light-transmitting electrode 023) is light-transmitting, other sides are all light-shielding. Therefore, only the light rays from the optical waveguide device 031 can be incident to the photoelectric converter 02, and the light rays not from the optical waveguide device 031 cannot be incident to the photoelectric converter 02

It should be noted that in the other sides of the photoelectric converter expect for the two sides provided with the light-shielding electrode 022 and the light-transmitting electrode 023, one side close to the collimator may not need to be provided with the light-shielding layer.

Further, the photosensitive unit as shown in FIGS. 2 and 3 may further comprise a switching transistor and a. light-shielding block (which are not shown in FIGS. 2 and 3). The switching transistor may be disposed on one side of the photoelectric converter 02 away from the collimator 032. The photoelectric converter 02 may be connected to a processor by the switching transistor. Therefore, the processor can selectively receive an electrical signal generated by the photoelectric converter 02 by the switching transistor. An active layer in the switching transistor is located on one side in the optical waveguide device close to the photoelectric converter 02. The light-shielding block may cover one side of the active layer in the switching transistor close to the optical waveguide device 031, such that the light-shielding block can shield and protect the active layer of the switching transistor. The light rays in a direction of the optical waveguide device 031 are prevented from being incident to the active layer of the switching transistor. The change of the characteristics of the active layer caused by illumination is avoided.

In conclusion, since in the photosensitive unit provided by the embodiment of the present disclosure, the collimator can screen the collimating light rays in the light rays incident from the target side, and the collimating light rays are controlled to be incident to the optical waveguide device, the collimating light rays are further guided into the photoelectric converter by the optical waveguide device. When the photosensitive unit is farther away from the finger, the photoelectric converter in the photosensitive unit can still receive the collimating light rays with a smaller degree of scattering. When the display device is manufactured, the photosensitive unit can be directly disposed below a cover plate without a need to cut an opening in the cover plate. Therefore, the difficulty of a manufacturing process for the display device is reduced.

Figure 4:
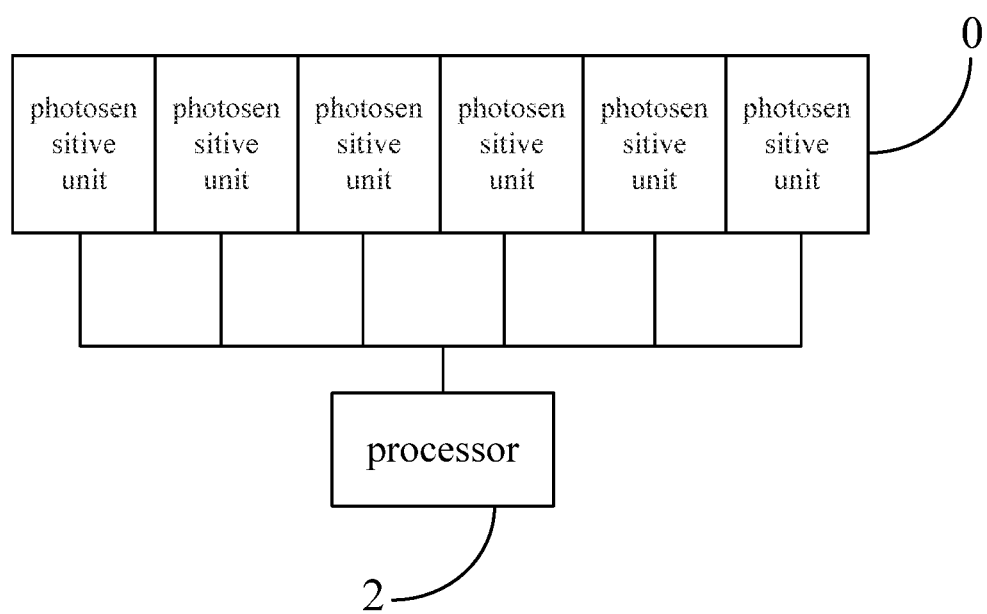
FIG. 4 is a structural schematic diagram of a photosensitive module provided by an embodiment of the present disclosure.

FIG. 4 is a structural schematic diagram of a photosensitive module provided by an embodiment of the present disclosure. As shown in FIG. 4, the photosensitive module may comprise a processor 2 and a plurality of photosensitive units 0. The photosensitive unit 0 may be the photosensitive unit as shown in FIG. 2 or 3. The processor 2 is connected to the photoelectric converter in each of the plurality of photosensitive units 0. The processor 2 may be a fingerprint recognition processor.

Optionally, the plurality of photosensitive units 0 in the photosensitive module may form at least one photosensitive unit group 11. Each photosensitive unit group 11 comprises at least one photosensitive unit 0. The optical waveguide devices in all photosensitive unit groups 11 may be connected into an integral part. The optical waveguide devices in any two photosensitive unit groups 11 are not in contact.

Figure 5:
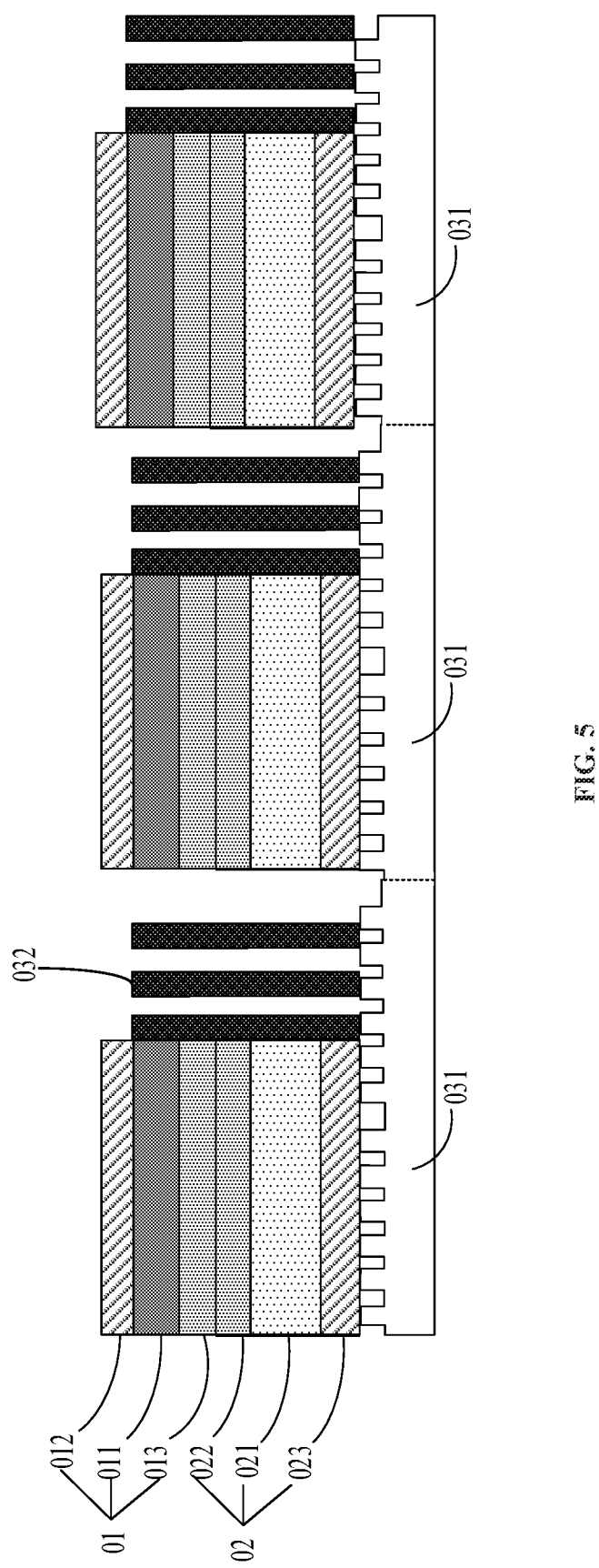
FIG. 5 is a partial structural schematic diagram of a photosensitive module provided by an embodiment of the present disclosure.

FIG. 5 is a partial structural schematic diagram of a photosensitive module provided by an embodiment of the present disclosure. The structure of a photosensitive unit in the photosensitive module may be the same as that of the photosensitive unit as shown in FIG. 2. In actual application, the structure of the photosensitive unit in the photosensitive module may also be the same as the structure of the photosensitive unit as shown in FIG. 3, which is not limited by the embodiment of the present disclosure. FIG. 5 shows three photosensitive units in total (not shown in FIG. 5). Besides, the three photosensitive units form one photosensitive unit group. The three optical waveguide devices 031 in the three photosensitive units are connected into an integral part.

Figure 6:
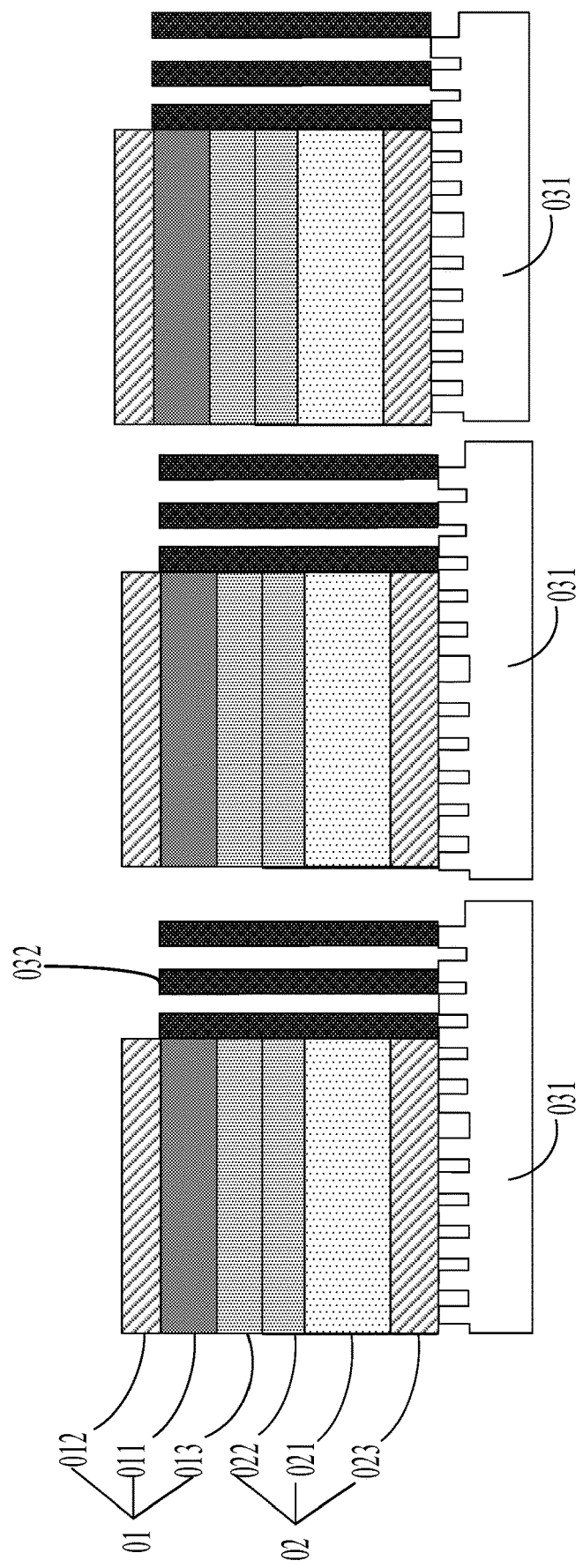
FIG. 6 is a partial structural schematic diagram of a photosensitive module provided by an embodiment of the present disclosure.

In actual application, FIG. 6 is another partial structural schematic diagram of a photosensitive module provided by an embodiment of the present disclosure. As shown in FIG. 6, based on FIG. 5, the three photosensitive units in FIG. 5 may form three photosensitive unit groups. Besides, each photosensitive unit group only comprises one photosensitive unit. The optical waveguide devices 031 in any two adjacent photosensitive unit groups are not in contact.

Optionally, when the object to be imaged needs to be imaged, the object to be imaged may be placed on the target sides of the light-emitting structures in the photosensitive module provided by the embodiment of the present disclosure, and the light-emitting structures are controlled to emit light to the object to be imaged. Then each photosensitive unit in the photosensitive module will receive the collimating light rays reflected by the object to be imaged, and electrical signals are sent to the processor according to the received collimating light rays. Finally, the processor can generate an image of the object to be imaged according to the intensity of each received electrical signal.

In conclusion, since in the photosensitive units in the photosensitive module provided by the embodiment of the present disclosure, the collimator can screen the collimating light rays in the light rays incident from the target sides, and the collimating light rays are controlled to be incident to the optical waveguide devices, the collimating light rays are further guided into the photoelectric converters by the optical waveguide devices. When the photosensitive units are farther away from the finger, the photoelectric converters in the photosensitive units can still receive the collimating light rays with a smaller degree of scattering. When the display device is manufactured, the photosensitive units can be directly disposed below a cover plate without a need to cut an opening in the cover plate. Therefore, the difficulty of a manufacturing process for the display device is reduced.

Figure 7:
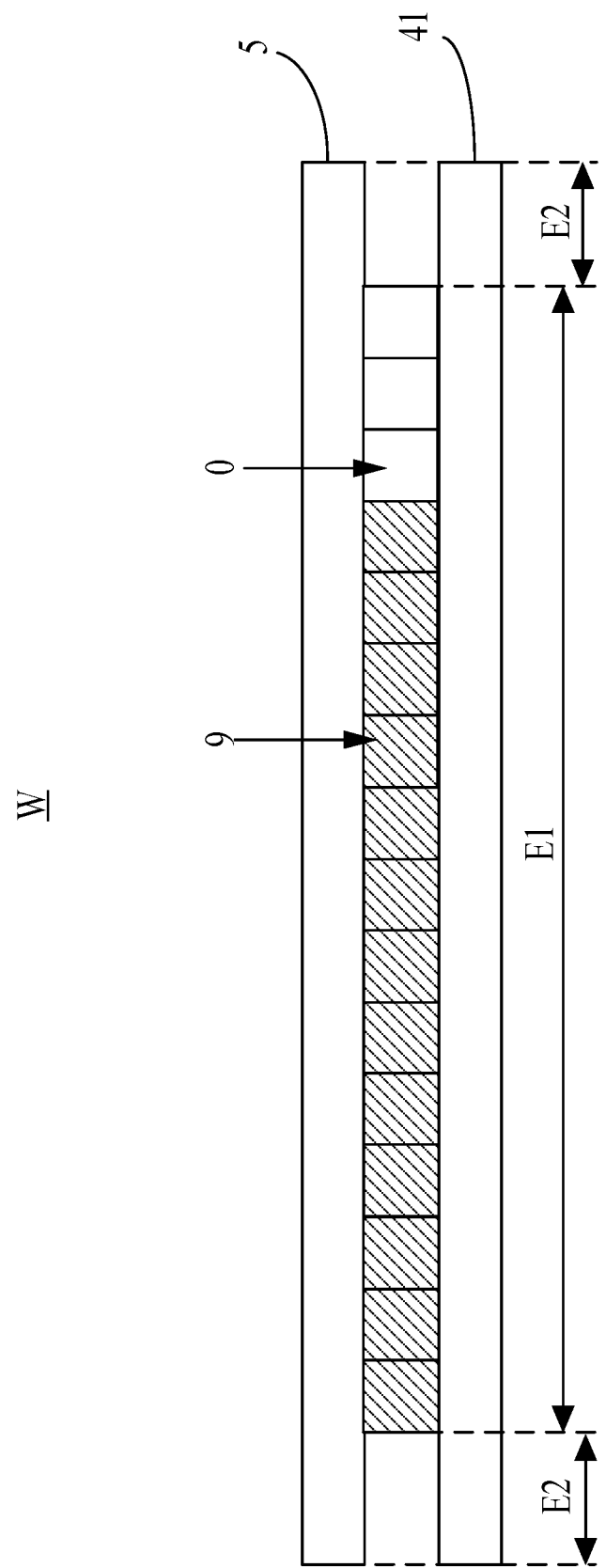
FIG. 7 is a structural schematic diagram of a display device provided by an embodiment of the present disclosure.

As shown in FIG. 7, the embodiment of the present disclosure provides a display device. The display device may be the display device W as shown in FIG. 1. The display device W may comprise a base substrate 41, a cover plate 5 and a photosensitive module. The photosensitive module may be the photosensitive module as shown in FIGS. 4, 5 or 6. The photosensitive module comprises a processor (not shown in FIG. 7) and a plurality of photosensitive units 0. The base substrate 41 and the cover plate 5 are disposed oppositely. The photosensitive units 0 are disposed between the base substrate 41 and the cover plate 5.

The photosensitive units 0 may be located in a display region E1 between the base substrate 41 and the cover plate 5. The photosensitive unit 0 may further comprise a pixel circuit (not shown in FIG. 7) connected to the light-emitting structure in the photosensitive unit 0. In each photosensitive unit, the pixel circuit may be configured to control the light-emitting structure to emit light, such that the display device displays an image. It should be noted that there still exists a non-display region E2 outside the display area between the base substrate 41 and the cover plate 5.

Optionally, the display device may further comprise a plurality of OLED pixel units 9. The photosensitive units 0 and the OLED pixel units 9 may be disposed between the base substrate 41 and the cover plate 5 side by side, and the photosensitive units 0 and the OLED pixel units 9 may be both located in the display area E1 between the base substrate 41 and the cover plate 5. Each OLED pixel unit 9 may comprise a pixel circuit and an OLED which are connected. In each OLED pixel unit 9, the pixel circuit may be configured to control the OLED to emit light, such that the display device displays an image.

In some embodiments, the light-emitting structure in the photosensitive unit may be the OLED. The display device can emit light by the OLED pixel units and the OLEDs in the photosensitive units to display the image, and can realize photosensitization by the photosensitive units.

Figure 8:
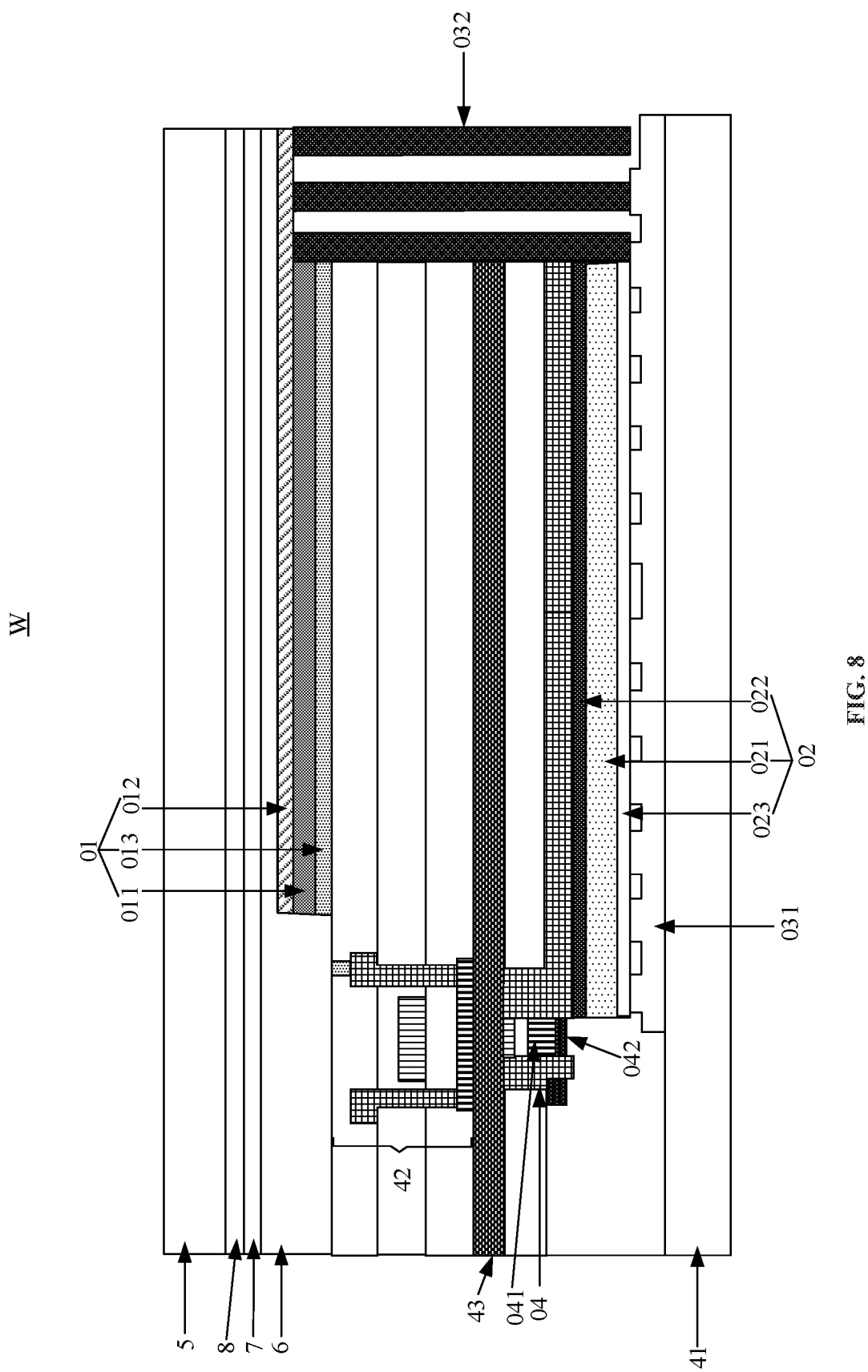
FIG. 8 is a structural schematic diagram of a photosensitive unit in a display device provided by an embodiment of the present disclosure.

Further, FIG. 8 is a structural schematic diagram of a photosensitive unit in a display device provided by an embodiment of the present disclosure. As shown in FIG. 8, in each photosensitive unit, the pixel circuit 42 and the switching transistor 04 are both located between the photosensitive converter 02 and the light-emitting structure 01. The switching transistor 04 may be disposed close to the optical waveguide device 031. The pixel circuit 42 is disposed away from the optical waveguide device 031. An insulating layer 43 may be disposed between the pixel circuit 42 and the switching transistor 44.

The switching transistor 04 may comprise a gate electrode, a source electrode, a drain electrode and an active layer 041. An orthogonal projection of the active layer 041 on the base substrate 41 is within an orthogonal projection of an opaque region (for example, the gate electrode in the pixel circuit 42) in the pixel circuit 42 on the base substrate 41. One side of the active layer 041 close to the photosensitive converter 02 is covered by a light-shielding block 042. One side of the collimator 032 close to the base substrate 41 is in contact with the optical waveguide device 031. One side of the collimator 032 away from the optical waveguide device 013 is flush with one side of the electroluminescence layer 011 of the OLED away from the optical waveguide device 031.

The orthogonal projection of the active layer 041 of the switching transistor 04 on the base substrate 41 is within the orthogonal projection of the opaque region in the pixel circuit 42 on the base substrate 41. Therefore, the opaque region in the pixel circuit 42 can shield the light rays incident to the display device from the cover plate 5, to prevent the characteristics of the active layer 041 from being changed by illumination.

Continuing to refer to FIG. 8, a thin film encapsulation (TFE) layer 6, a polarizer (POL) 7 and optically clear adhesive (OCA) 8 may be disposed between the cover plate 5 and the light-emitting structure 01.

Figure 9:
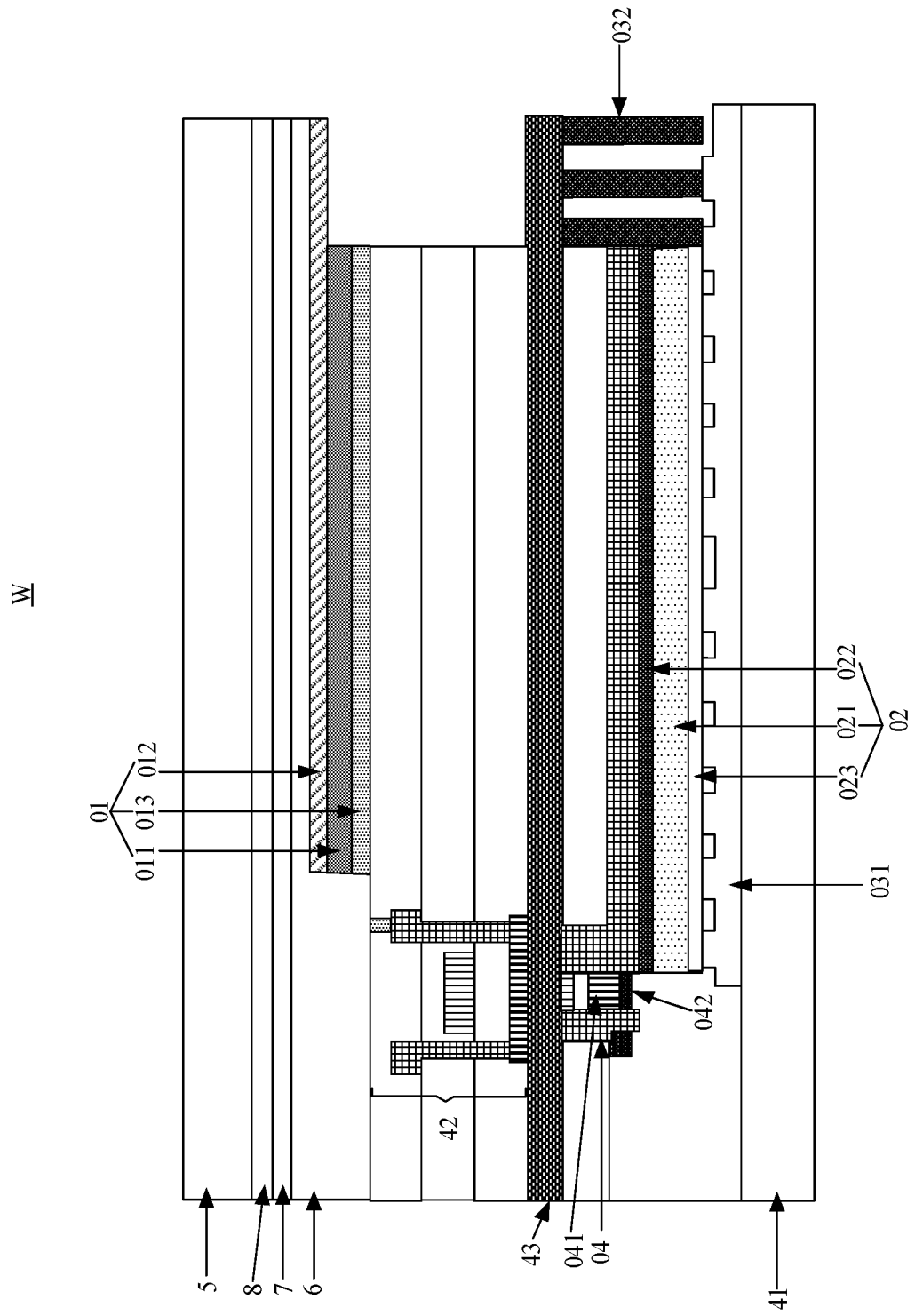
FIG. 9 is a structural schematic diagram of a photosensitive unit in another display device provided by an embodiment of the present disclosure.

FIG. 9 is another structural schematic diagram of a photosensitive unit in a display device provided by an embodiment of the present disclosure. As shown in FIG. 9, based on FIG. 8, one side of the collimator 032 close to the base substrate 041 may be in contact with the optical waveguide device 031. One side of the collimator 032 away from the base substrate 41 may also be flush with one side of the insulating layer 43 close to the optical waveguide device 031. At this point, the insulating layer 43 may be a glass substrate.

It should be noted that in the embodiment of the present disclosure, the photoelectric converter (for example, the photodiode) is disposed below the pixel circuit and the light-emitting structure (i.e., the OLED), such that a setting area of the photoelectric converter is larger. Therefore, the photoelectric converter with a larger light incident area may be disposed in the photosensitive unit. For the photoelectric converter, under the premise of the same light incident amount, the larger the light incident area is, the higher the intensity of the electrical signal output by the photoelectric converter is. Therefore, the photoelectric converter in the embodiment of the present disclosure can output the stronger electrical signal. Since the photosensitive module may be disposed in the display region of the display panel, the photosensitive module can adapt to a full-screen display panel.

Figure 10:
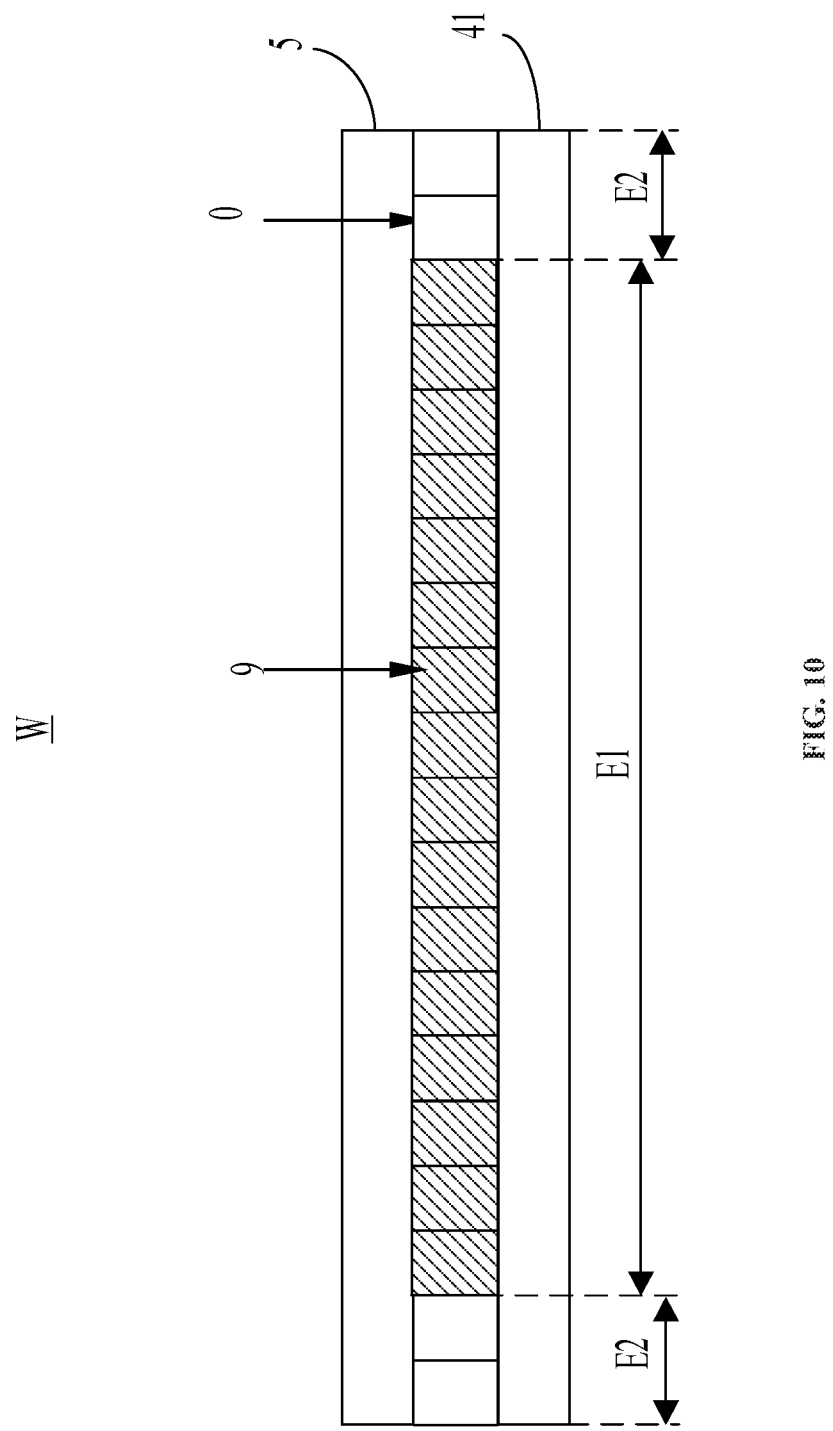
FIG. 10 is a structural schematic diagram of another display device provided by an embodiment of the present disclosure.

Optionally, FIG. 10 is another structural schematic diagram of a display device provided by an embodiment of the present disclosure. As shown in FIG. 10, based on FIG. 7, the OLED pixel units 9 may be disposed in the display region E1 between the base substrate 41 and the cover plate 5. The photosensitive units 0 may be disposed in the non-display region E2 between the base substrate 41 and the cover plate 5. The photosensitive units 0 do not comprise the pixel circuit. Exemplarily, the non-display region E2 may be the region of a home key in the display device, which is not limited by the embodiment of the present disclosure.

Optionally, a thickness sum of the optical waveguide device and the photoelectric converter in the photoelectric unit 0 in the embodiment of the present disclosure may be smaller than 100 micrometers. The distance between one side in the cover plate close to the collimator and one side in the collimator close to the cover plate may be 1 mm.

The display device in the embodiment of the present disclosure has a display function and a photosensitive function simultaneously. The display device may be any product or part having the display function and the photosensitive function, such as electronic paper, a mobile phone, a tablet computer, a television, a display, a laptop, a digital photo frame and a navigator.

In conclusion, since in the photosensitive unit provided by the embodiment of the present disclosure, the collimator can screen the collimating light rays in the light rays incident from the target side, and the collimating light rays are controlled to be incident to the optical waveguide device, the collimating light rays are further guided into the photoelectric converter by the optical waveguide device. When the photosensitive unit is farther away from the finger, the photoelectric converter in the photosensitive unit can still receive the collimating light rays with a smaller degree of scattering. When the display device is manufactured, the photosensitive unit can be directly disposed below a cover plate without a need to cut an opening in the cover plate. Therefore, the difficulty of a manufacturing process for the display device is reduced.

The foregoing embodiments are only alternative embodiments of the present disclosure and are not intended to limit the present disclosure. Within the spirits and principle of the present disclosure, any modifications, equivalent substitutions, improvements, etc., are within the scope of protection of the present disclosure.

What is claimed is:

1. A photosensitive unit, wherein the photosensitive unit comprises: a light-emitting structure, a photoelectric converter, an optical waveguide device and a collimator; the photoelectric converter and the collimator are disposed on the same side of the optical waveguide device side by side, the light-emitting structure is disposed on one side of the photoelectric converter away from the optical waveguide device, and one side on the photoelectric converter close to the light-emitting structure is light-shielding;
   the light-emitting structure is capable of emitting light rays to a target side thereof away from the photoelectric converter;
   the collimator is capable of screening collimating light rays in the light rays incident from the target side, and controlling the collimating light rays to be incident to the optical waveguide device, wherein a propagation direction before the collimating light rays are incident to the collimator is in the preset range of a first direction, and the first direction is perpendicular to a light emergent surface of the light-emitting structure; and the optical waveguide device is capable of controlling the collimating light rays incident from the collimator to be incident to the photoelectric converter.

2. The photosensitive unit according to claim 1, wherein a surface in the optical waveguide device toward the collimator is a first surface, a light incident grating is disposed in a region in the first surface facing the collimator, and a light emergent grating is disposed in a region in the first surface facing the photoelectric converter; and the light incident grating is configured to guide the incident collimating light rays into the optical waveguide device, and the light emergent grating is configured to guide the collimating light rays in the optical waveguide device to the photoelectric converter.

3. The photosensitive unit according to claim 1, wherein the collimator comprises a plurality of light absorption strips, the plurality of light absorption strips are disposed in parallel, and a length direction of each light absorption strip is parallel with the first direction, and a gap exists between any two adjacent light absorption strips.

4. The photosensitive unit according to claim 1, wherein the collimator comprises a first light absorption board and a second light absorption board, the first light absorption board and the second light absorption board are disposed in parallel, and are both perpendicular to the first direction; and the first light absorption board is provided with a first opening, the second light absorption board is provided with a second opening, and orthogonal projections of the first opening and the second opening on the optical waveguide device are completely overlapped.

5. The photosensitive unit according to claim 1, wherein the photoelectric converter is a photodiode, the photodiode comprises a photoelectric converting layer, one side of the photoelectric converting layer close to the light-emitting structure is provided with a light-shielding electrode, and one side of the photoelectric converting layer away from the light-emitting structure is provided with a light-transmitting electrode.

6. The photosensitive unit according to claim 1, wherein the light-emitting unit is an organic light-emitting diode, the organic light-emitting diode comprises an electroluminescence layer and a first electrode layer and a second electrode layer which are located on each of the two sides of the electroluminescence layer respectively, the first electrode layer is disposed away from the photoelectric converter, and the second electrode layer is disposed close to the photoelectric converter; and the first electrode layer is a light-transmitting electrode, and the second electrode layer is a light-shielding electrode.

7. The photosensitive unit according to claim 1, wherein the photosensitive unit further comprises a switching transistor, the switching transistor is disposed on one side of the photoelectric converter away from the collimator, and the photoelectric converter is connected to a processor by the switching transistor.

8. The photosensitive unit according to claim 7, wherein the photosensitive unit further comprises a light-shielding block, an active layer in the switching transistor is located on one side in the optical waveguide device close to the photoelectric converter, and the light-shielding block covers one side of the active layer close to the optical waveguide device.

9. The photosensitive unit according to claim 1, wherein other sides on the photoelectric converter except the one side close to the optical waveguide device are all light-shielding.

10. The photosensitive unit according to claim 2, wherein the light incident grating and the light emergent grating are both nano-gratings.

11. The photosensitive unit according to claim 10, wherein a thickness sum of the optical waveguide device and the photoelectric converter is smaller than 100 micrometers.

12. A photosensitive module, wherein the photosensitive module comprises a processor and a plurality of photosensitive units, the photosensitive unit comprises: a light-emitting structure, a photoelectric converter, an optical waveguide device and a collimator; the photoelectric converter and the collimator are disposed on the same side of the optical waveguide device side by side, the light-emitting structure is disposed on one side of the photoelectric converter away from the optical waveguide device, and one side on the photoelectric converter close to the light-emitting structure is light-shielding;

the light-emitting structure is capable of emitting light rays to a target side thereof away from the photoelectric converter; the collimator is capable of screening collimating light rays in the light rays incident from the target side, and controlling the collimating light rays to be incident to the optical waveguide device; wherein a propagation direction before the collimating light rays are incident to the collimator is in the preset range of a first direction, and the first direction is perpendicular to a light emergent surface of the light-emitting structure; and the optical waveguide device is capable of controlling the collimating light rays incident from the collimator to be incident to the photoelectric converter, and the processor is connected to the photoelectric converter in each photosensitive unit.

13. The photosensitive module according to claim 12, wherein the plurality of photosensitive units form at least one photosensitive unit group, each photosensitive unit group comprises at least one photosensitive unit, the optical waveguide devices in all photosensitive unit groups are connected into an integral part, and the optical waveguide devices in any two photosensitive unit groups are not in contact.

14. The photosensitive module according to claim 12, wherein the processor is a fingerprint recognition processor.

15. A display device, wherein the display device comprises a base substrate, a cover plate and a photosensitive module, the photosensitive module comprises a processor and a plurality of photosensitive units, the base substrate and the cover plate are disposed oppositely, and the photosensitive units are disposed between the base substrate and the cover plate;

the photosensitive unit comprises: a light-emitting structure, a photoelectric converter, an optical waveguide device and a collimator; the photoelectric converter and the collimator are disposed on the same side of the optical waveguide device side by side, the light-emitting structure is disposed on one side of the photoelectric converter away from the optical waveguide device, and one side on the photoelectric converter close to the light-emitting structure is light-shielding; the light-emitting structure is capable of emitting light rays to a target side thereof away from the photoelectric converter; the collimator is capable of screening collimating light rays in the light rays incident from the target side, and controlling the collimating light rays to be incident to the optical waveguide device; wherein a propagation direction before the collimating light rays are incident to the collimator is in the preset range of a first direction, and the first direction is perpendicular to a light emergent surface of the light-emitting structure; the optical waveguide device is capable of controlling the collimating light rays incident from the collimator to be incident to the photoelectric converter, and the processor is connected to the photoelectric converter in each photosensitive unit.

16. The display device according to claim 15, wherein the photosensitive units are located in a display region between the base substrate and the cover plate, the photosensitive unit further comprises a pixel circuit connected to the light-emitting structure, and the pixel circuit is configured to control the light-emitting structure to emit light, such that the display device displays an image.

17. The display device according to claim 16, wherein the photosensitive unit further comprises a switching transistor, in the photosensitive unit:

the pixel circuit and the switching transistor are both located between the optical waveguide device and the light-emitting structure, the switching transistor is disposed close to the optical waveguide device, the pixel circuit is disposed away from the optical waveguide device, and an insulating layer is disposed between the pixel circuit and the switching transistor; and an orthogonal projection of an active layer of the switching transistor on the base substrate is within an orthogonal projection of an opaque region in the pixel circuit on the base substrate.

18. The display device according to claim 17, wherein the light-emitting structure comprises an OLED, and one side of the collimator away from the optical waveguide device is flush with one side of an electroluminescence layer of the OLED away from the base substrate.

19. The display device according to claim 17, wherein one side of the collimator away from the optical waveguide device is flush with one side of the insulating layer close to the optical waveguide device.

20. The display device according to claim 15, wherein the plurality of photosensitive units are all disposed in a non-display region between the base substrate and the cover plate.

* * * * *